(12) United States Patent
Anand et al.

(10) Patent No.: US 7,911,820 B2
(45) Date of Patent: Mar. 22, 2011

(54) REGULATING ELECTRICAL FUSE PROGRAMMING CURRENT

(75) Inventors: Darren L. Anand, Essex Junction, VT (US); John A. Fifield, Underhill, VT (US); John R. Goss, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 12/176,543

(22) Filed: Jul. 21, 2008

(65) Prior Publication Data

US 2010/0014373 A1 Jan. 21, 2010

(51) Int. Cl.
*G11C 17/16* (2006.01)

(52) U.S. Cl. .................................... 365/96; 365/189.16

(58) Field of Classification Search ................. 365/96, 365/94, 148, 189.16, 189.06, 225.7
See application file for complete search history.

(56) References Cited

U.S. PATENT DOCUMENTS

| | | | |
|---|---|---|---|
| 5,635,854 A | 6/1997 | Shimanek et al. | |
| 6,054,893 A * | 4/2000 | Singh | 327/525 |
| 6,384,666 B1 | 5/2002 | Bertin et al. | |
| 6,501,107 B1 | 12/2002 | Sinclair et al. | |
| 7,075,127 B2 | 7/2006 | Kothandaraman et al. | |
| 7,119,603 B2 * | 10/2006 | Newman | 327/525 |
| 7,170,299 B1 | 1/2007 | Anand et al. | |
| 7,180,320 B2 | 2/2007 | Braceras et al. | |
| 7,253,496 B2 * | 8/2007 | Jenne et al. | 257/530 |
| 7,405,590 B1 * | 7/2008 | Kaneko | 326/38 |
| 7,545,665 B2 * | 6/2009 | Luich et al. | 365/96 |
| 7,710,813 B1 * | 5/2010 | Im et al. | 365/225.7 |
| 7,724,600 B1 * | 5/2010 | Im et al. | 365/225.7 |
| 2006/0152990 A1 * | 7/2006 | Huang | 365/225.7 |

* cited by examiner

*Primary Examiner* — Anh Phung
*Assistant Examiner* — Douglas King
(74) *Attorney, Agent, or Firm* — Cantor Colburn LLP; Michael LeStrange

(57) ABSTRACT

An apparatus for regulating eFUSE programming current includes a current control generator receiving an input reference current through a first current path of reference fuses, the input reference current proportional to a desired eFUSE programming current; a second current path including a reference programming FET and a second group of reference fuses; and a voltage comparator coupled to a gate terminal of the reference programming FET so as to adjust the gate voltage of the reference programming FET to equalize a first voltage across the first current path with a second voltage across the second current path. The gate voltage of the reference programming FET is an output of the current control generator, coupled to corresponding gates of one or more selected programming devices of an eFUSE array such that the selected programming devices source the desired eFUSE programming current to a selected eFUSE to be programmed.

20 Claims, 4 Drawing Sheets

REGULATING ELECTRICAL FUSE PROGRAMMING CURRENT

BACKGROUND

The present invention relates generally to semiconductor devices and, more particularly, to an apparatus and method for regulating electrical fuse programming current in semiconductor devices.

Electrically programmable fuses (eFUSEs) or electrical fuses are widely used to implement memory redundancy functionality in dynamic random access memory (DRAM), static random access memory (SRAM) and embedded memory devices. Programmable fuses can also be utilized in applications such as electronic chip identification, product feature personalization, and thermal diode calibration, to name a few. In a redundancy application, for example, chips returned from fabrication are usually tested and a certain percentage of them are usually found to be bad (e.g., from random contingencies that may occur in the fabrication process). The percentage of good, usable chips is commonly referred to as the "yield." Accordingly, redundancy may enable programming a chip at the testing phase so that flawed portions of the chip are not used in favor of unflawed redundant portions, thereby increasing the yield and decreasing the percentage of chips that must be thrown away as unusable. Many of the applications for electrical fuses combine the electrical fuse with the use of a memory in some way, for example, as part of a memory cell.

Additionally, in electronic chip identification or part number identification, an eFUSE may be used to "program" or write information into a non-volatile memory, which may be comprised of individual memory cells, and the information can then be read from the memory as a unique chip identifier or part number identifier. Furthermore, for thermal diode calibration, a non-volatile memory programmed using electronic fuses can be used to hold a test temperature and the thermal diode voltage read at the test temperature.

Regardless of the specific application environment, an eFUSE is typically programmed by passing a sufficient current through the structure such that its resistance is significantly altered from its initially fabricated state. In order to determine whether a particular fuse has been programmed or not, a sense circuit may be used to detect one of two possible "states" of the fuse. More specifically, the sense circuit holds one of two latched values therein, which is driven by a comparison between a fuse voltage generated in response to a current directed through the fuse, by the sense circuit, and a reference voltage generated within the sense circuit. The reference voltage is designed to be between a fuse voltage corresponding to the programmed state and a fuse voltage corresponding to the unprogrammed state.

To achieve consistent operation and desired yields for electrical fuse programming, an accurate programming current is required. If the programming current is too low, insufficient power is coupled into the fuse to shift its resistance to a required level for sensing the blown state. If the programming current is too high, the fuses can rupture, causing reliability fails as well as the potential for "healing" over time (e.g., the "programmed" can decrease to the unprogrammed resistance over time). To avoid these problems, a controlled programming current is desired which is consistent from lot to lot.

A conventional eFUSE programming current scheme is illustrated in FIG. 1, in which a circuit path 100 includes a PFET programming transistor (P0) that supplies current to a bitline (BL) 102 connected to a group of fuse bitcells 104. A given select line (e.g., RSEL_0, RSEL_1, etc.) enables a selected bitcell 104 for programming by turning on an NFET 106 placed in series with a fuse (e.g., polysilicon) 108. The programming voltage source (FSOURCE) used to supply the fuse programming current is at a higher voltage with respect to the nominal $V_{DD}$ supply rail of the chip logic devices. For example, if $V_{DD}$ is 1.0 volt, then FSOURCE may be about 1.5-1.7 volts. To determine the state of a given fuse on an output FOUT, the bitline 102 is also coupled to a sense amplifier 110 as known in the art.

Ideally, the target programming current for each selected fuse is typically on the order of about 7-10 milliamps (ma), with the best programming conditions occurring within a narrow current range. However, across a full process window, the FET device current variance is about ±17% at a single gate voltage. Additionally, the full rail gate voltage (i.e., $V_{DD}$-GND) cannot be controlled to better than about 100 millivolts (mV) of tolerance, which causes additional error in the programming current. Such variability causes insufficient programming current for weak devices and/or too much programming current for strong devices across the process window.

There are a few known solutions to this problem, all of which have drawbacks associated therewith. For example, one solution is to adjust the programming condition to the circuit depending on parametric data taken from the chip. This data would include, for example FET device Id_sat (saturation current) and parametrics for the device type used to program the fuse. Using this information, the applied conditions can be tailored to optimize yield on a chip-by-chip or wafer-by-wafer basis. However, this method is time consuming and very expensive to implement in a manufacturing environment. Another solution is to use redundant fuses or error correction (ECC) on the fuses to improve device yield. This method can still have issues with ruptured fuse reliability and suffers from area loss due to the redundant fuses and ECC circuits. Still another solution is to try to provide the programming current directly from a tester. This is difficult to implement since programming current is switched to a selected fuse, and although a tester can supply an accurate steady state current, a switched current will have high voltage compliance ranges and require a settling time from interaction with pin inductance. L di/dt will create unknown voltage spikes and complicate programming.

Accordingly, it would be desirable to be able to provide accurate fuse programming current for consistent fuse blow operation with minimal test overhead.

SUMMARY

The foregoing discussed drawbacks and deficiencies of the prior art are overcome or alleviated, in an exemplary embodiment, by an apparatus for regulating electrical fuse (eFUSE) programming current in semiconductor devices, including a current control generator configured to receive an input reference current through a first current path that includes a first group of reference fuses, the input reference current proportional to a desired eFUSE programming current; a second current path associated with the current control generator, the second current path including a reference programming FET and a second group of reference fuses; and a voltage comparator associated with the current control generator, with an output of the voltage comparator coupled to a gate terminal of the reference programming FET so as to adjust the gate voltage of the reference programming FET to equalize a first voltage across the first current path with a second voltage across the second current path; wherein the gate voltage of the reference programming FET is an output of the current control generator, coupled to corresponding gates of one or more selected programming devices of an eFUSE array such that each of the one or more selected programming devices sources the desired eFUSE programming current to a selected eFUSE to be programmed.

In another embodiment, an electrical fuse (eFUSE) array with programming current control includes a plurality of bitlines arranged in columns; a plurality of bitcells associated with each bitline, each bitcell comprising an eFUSE device coupled to the associated bitline and a programming NFET in series with the eFUSE device, with each programming NFET controlled by one of a plurality of row select control signals; a current control generator configured to receive an input reference current through a first current path that includes a first group of reference fuses, the input reference current proportional to a desired eFUSE programming current; a second current path associated with the current control generator, the second current path including a reference programming PFET and a second group of reference fuses; and a voltage comparator associated with the current control generator, with an output of the voltage comparator coupled to a gate terminal of the reference programming PFET so as to adjust the gate voltage of the reference programming PFET to equalize a first voltage across the first current path with a second voltage across the second current path; wherein the gate voltage of the reference programming PFET is an output of the current control generator, coupled to corresponding gates of programming PFET devices associated with each bitline such that each of the one or more selected programming devices sources the desired eFUSE programming current to a selected eFUSE to be programmed.

In still another embodiment, a method for regulating electrical fuse (eFUSE) programming current in semiconductor devices includes configuring a current control generator to receive an input reference current through a first current path that includes a first group of reference fuses, the input reference current proportional to a desired eFUSE programming current; configuring a second current path associated with the current control generator, the second current path including a reference programming FET and a second group of reference fuses; and configuring a voltage comparator associated with the current control generator, with an output of the voltage comparator coupled to a gate terminal of the reference programming FET so as to adjust the gate voltage of the reference programming FET to equalize a first voltage across the first current path with a second voltage across the second current path; wherein the gate voltage of the reference programming FET is an output of the current control generator, coupled to corresponding gates of one or more selected programming devices of an eFUSE array such that each of the one or more selected programming devices sources the desired eFUSE programming current to a selected eFUSE to be programmed.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is an apparatus and method for regulating electrical fuse programming current in semiconductor devices. Briefly stated, the embodiments utilize a circuit that automatically biases the terminal voltages of the PFET programming devices to deliver consistent programming current across the process window. This is done, for example, by receiving a DC reference current from a tester, and establishing a reference voltage across a first group of reference fuses in a first current path. A second current path is made from a sample programming FET and a second group of reference fuses. An active circuit compares the voltages across the first and second reference fuses and adjusts the gate drive of the sample programming PFET to establish a gate voltage level which will make the currents in the first and second current paths equal, or at a desired multiple. This generated gate voltage level is "steered" to the actual programming PFET devices in an eFUSE array to tightly regulate fuse programming current.

In so doing, the present embodiments provide for a consistent fuse blow operation with minimal test overhead. The same external voltages and initialization flow can be used on every chip independent of the process set point. Redundant fuses and ECC circuits can be avoided by improving fuse yields to sufficient levels through more consistent programming. In addition, the tracking of on-chip parametrics is also avoided which saves time and overhead.

Figure 1:
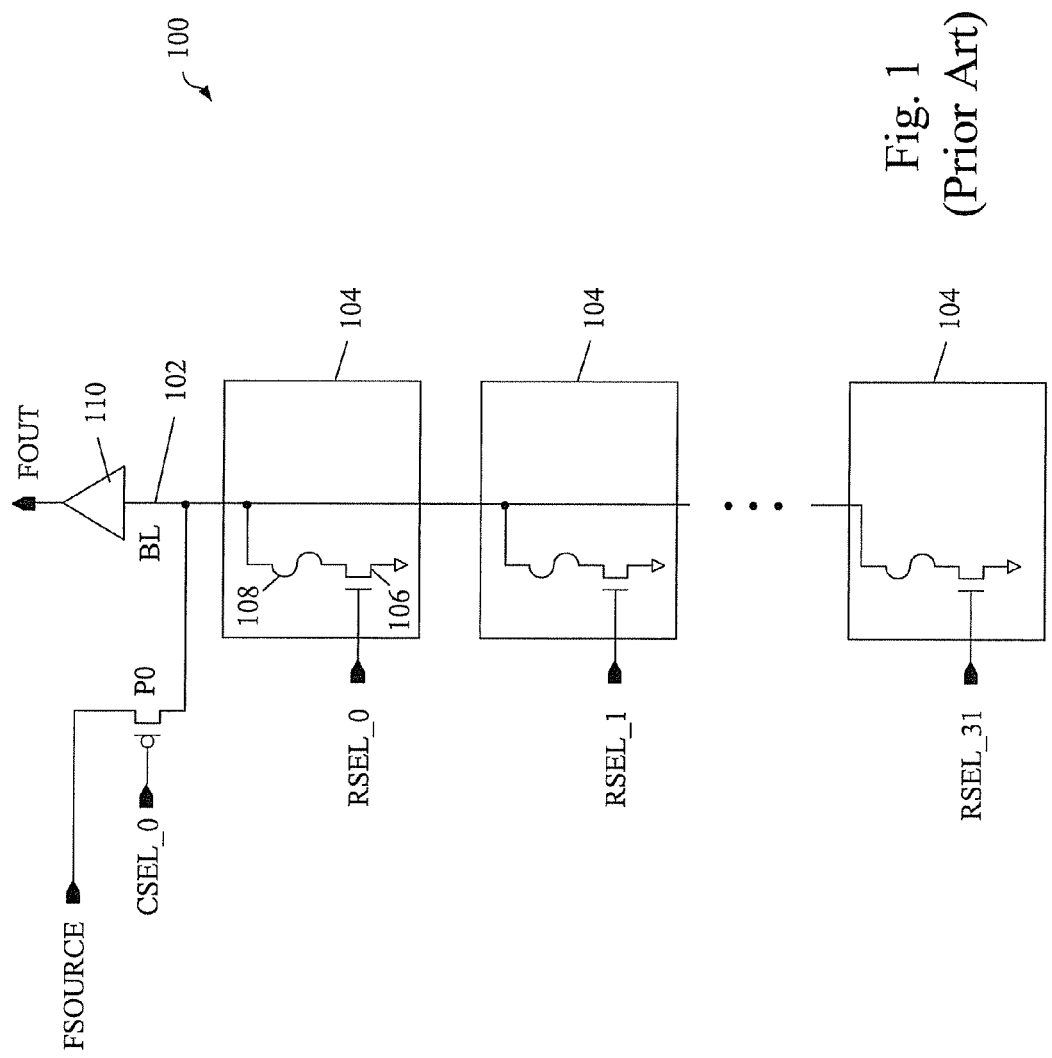
FIG. 1 is a schematic diagram of an existing eFUSE programming current scheme.
Figure 2:
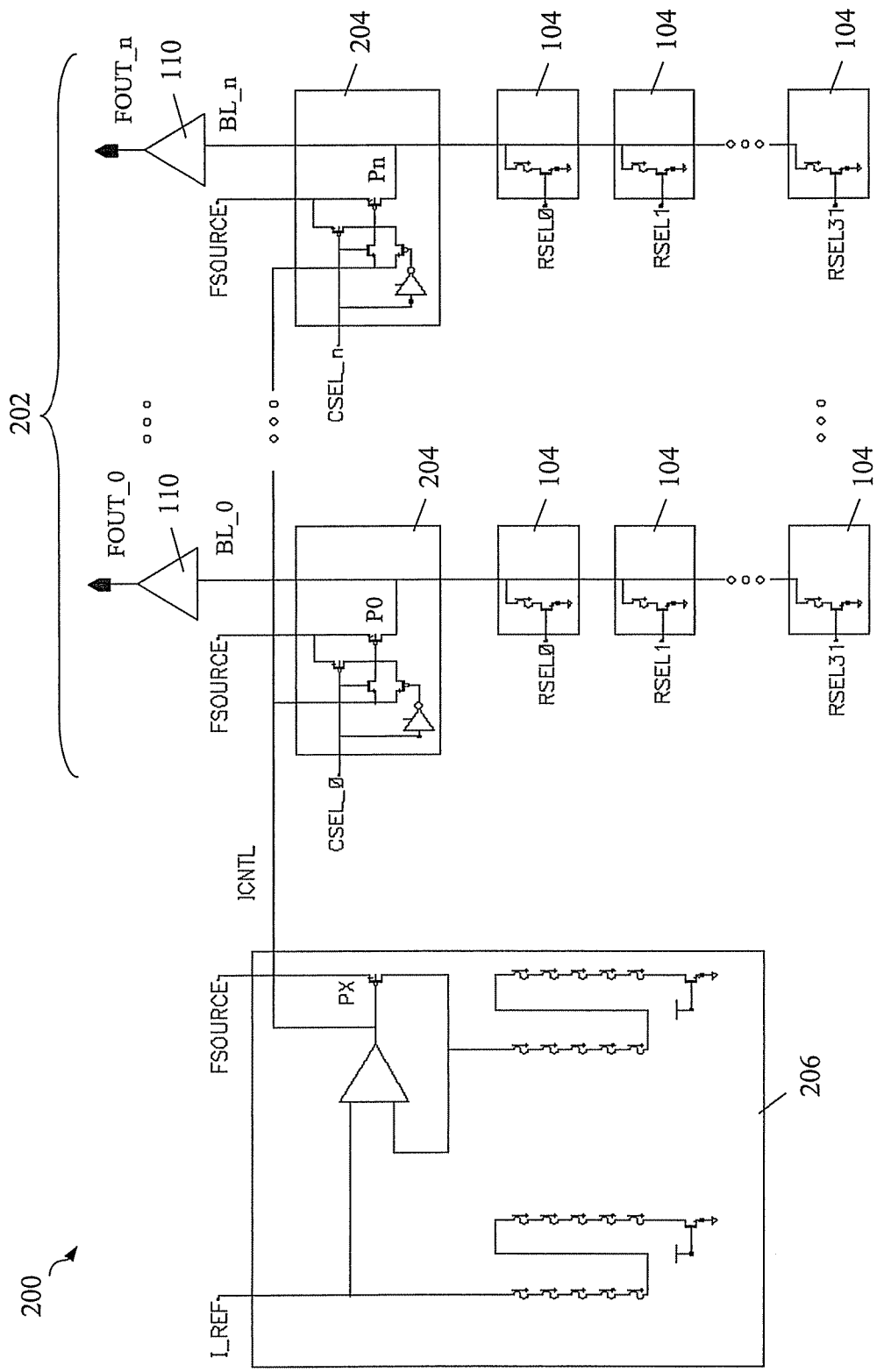
FIG. 2 is a schematic diagram of an apparatus for regulating eFUSE programming current in semiconductor devices, in accordance with an embodiment of the invention.

Referring now to FIG. 2, there is shown a schematic diagram of an apparatus 200 for regulating eFUSE programming current in semiconductor devices, in accordance with an embodiment of the invention. For ease of description, like elements in FIG. 2 are designated with the same reference numbers as in FIG. 1. In the exemplary embodiment of FIG. 2, an eFUSE array generally indicated at 202 is depicted has being 32 rows by 'n' columns, however it will be understood that the principles discussed herein are equally applicable to arrays of different sizes. In addition, the apparatus 200 includes a current control block 204 (described in further detail below) associated with each bitline (column) for selectively enabling programming current to be applied to a bitcell fuse in the array column. Further, a current control generator (ICNTL Generator) 206 provides an analog voltage level output, ICNTL, which regulates the programming current applied to the individual fuse devices to the eFUSE array, as also described in further detail below.

Figure 3:
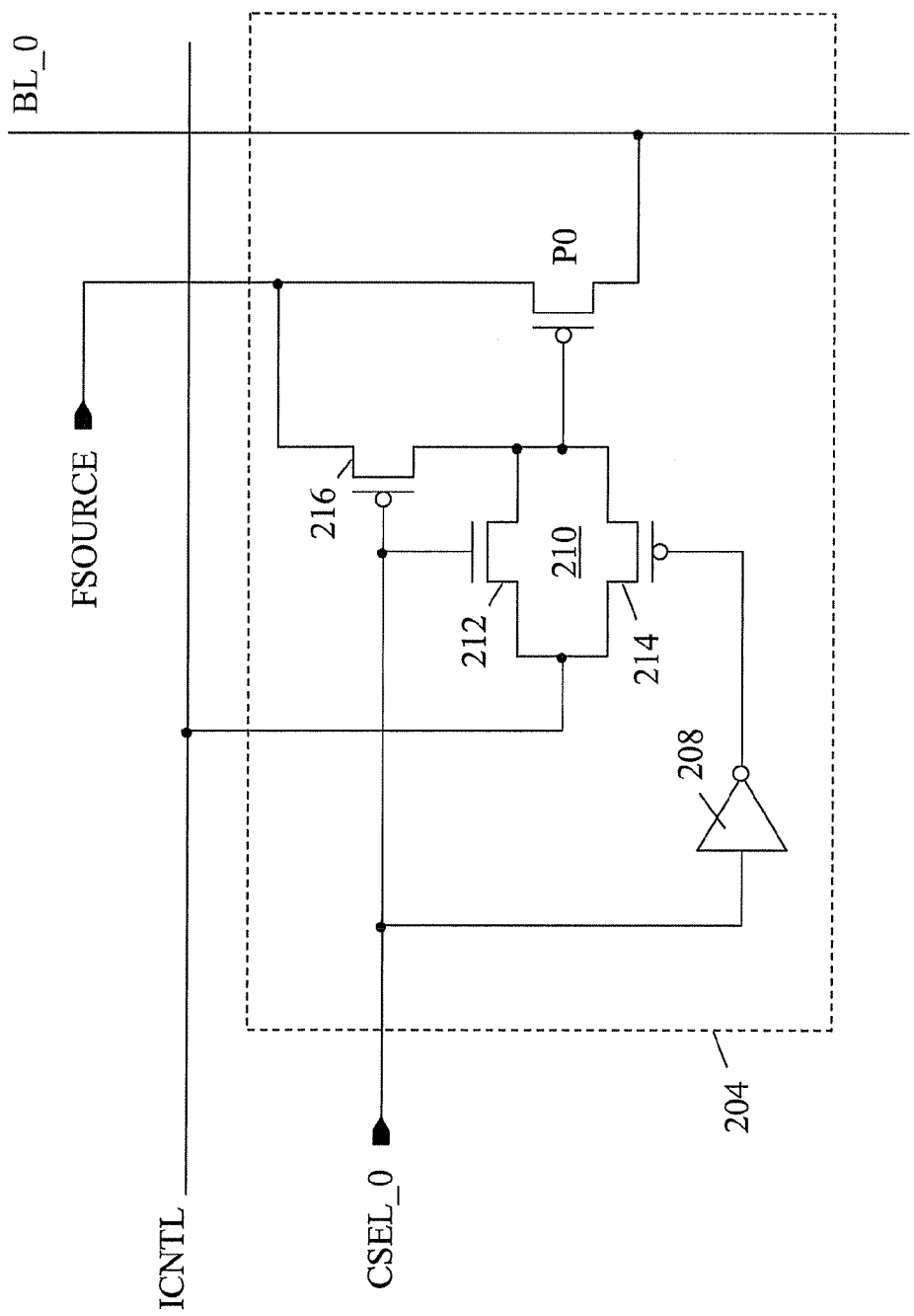
FIG. 3 is an enlarged schematic view of a current control block shown in FIG. 2.

Turning first to a more detailed explanation of the current control blocks 204, it will be seen from FIG. 3 that (in contrast to FIG. 1) the column select control signal CSEL_0 is not directly coupled to the gate of the PFET programming transistor P0. Rather, CSEL_0 (and the inverted value thereof through inverter 208) is coupled to respective gate terminals of a complementary pass gate pair 210, including NFET 212 and PFET 214. Specifically, the true value of CSEL_0 is coupled to the gate of NFET 212 and the inverted value of CSEL_0 is coupled to the gate of PFET 214. A first common or input node of the pass gate pair 210 is coupled to the analog voltage level output ICNTL described above. In addition, the true value of CSEL_0 is also coupled to the gate of another PFET 216, the source terminal of which is coupled to FSOURCE, and the drain terminal of which is coupled to a second common or output node of the complementary pass gate pair 210. This second common node of the complementary pass gate pair 210 is in turn coupled to the gate of the programming transistor P0.

In operation, it will be seen that if the column select signal CSEL_0 is de-asserted (i.e., that column is not selected for fuse programming), both NFET 212 and PFET 214 of the pass gate pair 210 will be turned off. As such, the analog voltage level output ICNTL is decoupled from the gate of P0. Instead, the logical low input from CSEL_0 turns PFET 216 on, thereby shorting the gate and source terminals of P0 to the voltage on FSOURCE, which prevents the programming transistor P0 from conducting fuse programming current.

On the other hand, if CSEL_0 is asserted, then both NFET 212 and PFET 214 of the pass gate pair 210 will be turned on. In this instance, the analog voltage level output ICNTL is coupled to the gate of programming transistor P0, while PFET 216 is rendered nonconductive to prevent shorting of the gate and source terminals of P0. It should be noted that in order to ensure PFET 216 is completely turned off when CSEL_0 is asserted, the voltage on CSEL_0 should be substantially equal to FSOURCE (e.g., 1.5 volts) instead of the nominal chip $V_{DD}$ logical high voltage value (e.g., 1.0 volt). In order to assert CSEL_0 at this increased voltage, the chip circuitry may be provided with a conventional voltage level translator, as known in the art.

Figure 4:
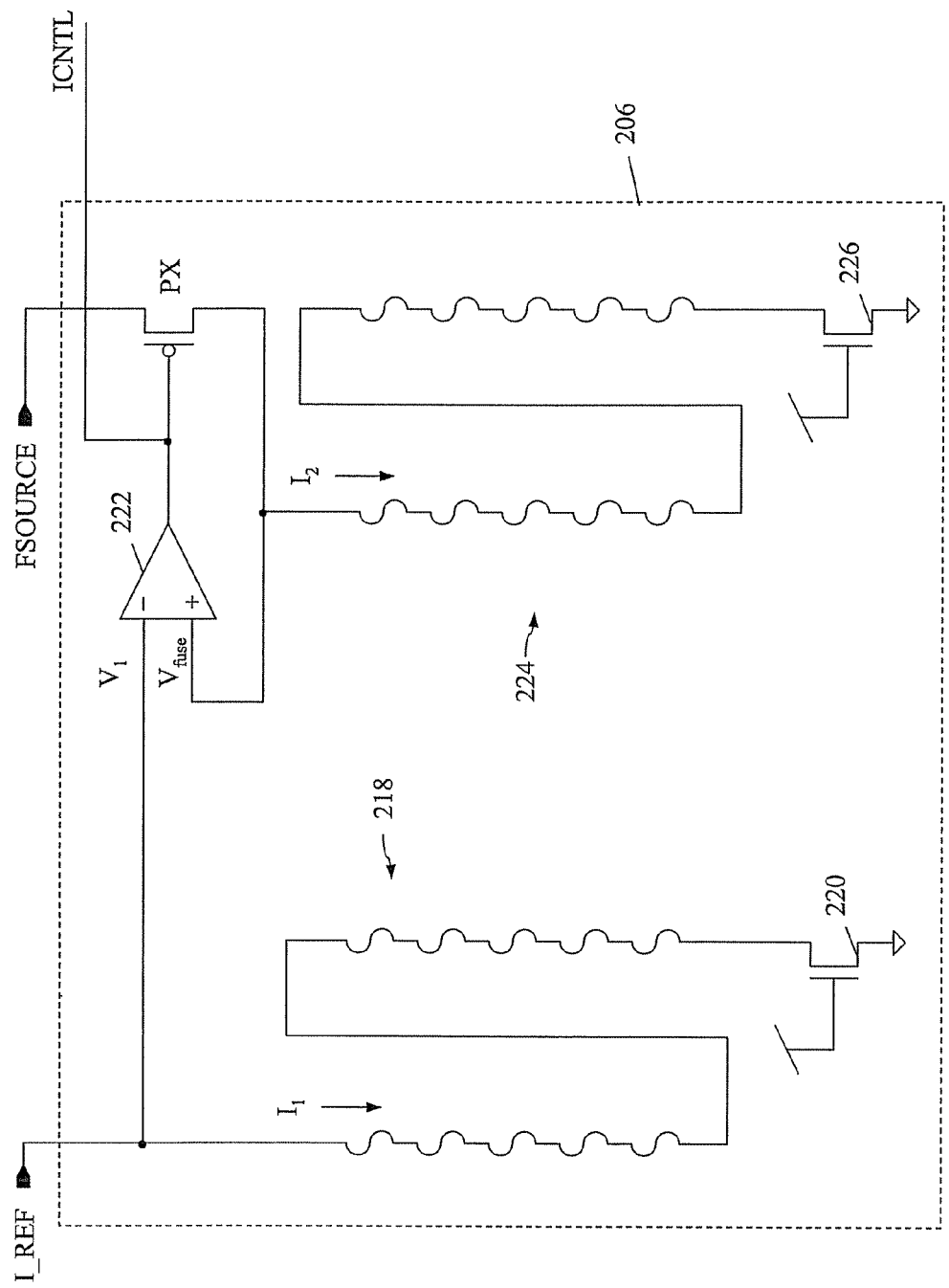
FIG. 4 is an enlarged schematic view of a current control generator shown in FIG. 2.

The advantages of steering the analog voltage level output ICNTL to the gate of programming transistor P0 when fuse programming is to be implemented (instead of simply grounding the gate of P0 as in FIG. 1) will be appreciated upon consideration of FIG. 4, which is an enlarged schematic view of the current control generator 206 shown in FIG. 2. A reference current, for example, 0.8 ma is provided by a manufacturing tester and applied to the I_REF pin of the ICNTL generator. An exemplary accuracy of about 0.2%+4 µa+1 µa/volt may be attained on the commercially available Adventest model T6672 for example, and is more than adequate for this use as a current reference. Other mechanisms of providing accurate current (e.g., bandgap circuits) are also contemplated, however. As explained hereinafter, the exemplary reference current is a scaled down version of a desired programming current to be applied to the fuse devices of the bitcells. Thus, if a desired programming current is 8 ma, then the ICNTL generator 206 utilizes a scaled factor of that programming current. In the example depicted, the reference current is reduced by a factor of 10 (i.e., 0.8 ma) from the desired programming current. It will be appreciated that other scaling factors could also be used.

In any case, the reference current, $I_1$ (e.g., 0.8 ma) on pin I_REF is directed through a first group 218 of ten eFUSE elements and through an NFET programming device 220 that is scaled to 1/10 the size of the programming NFET of the bitcells within the eFUSE array 202. The reference current is set at a low enough level so as to avoid damage to the group of reference fuses. In other words, actual programming/resistance change of the eFUSE elements in the ICNTL generator 206 is to be avoided. In this specific example the reference current $I_1$ is set to 0.8 ma which is 1/10 of the desired programming current of a given eFUSE element (having an impedance on the order of about 100Ω each). Thus, a group of fuses is used herein in order to average any geometric variations associated with the formation thereof, as well as to establish a 10X impedance scale. When the reference current $I_1$ is applied to the first current path (i.e., the first group 218 of eFUSE elements and NFET 220), a first voltage $V_1$ will develop on node I_REF and establish a reference voltage at an inverting terminal (−) of operational amplifier (OPAMP) 222 that serves as a voltage comparator.

As further shown in FIG. 4, a reference programming PFET device, PX, provides a second current $I_2$ through a second group 224 of ten eFUSE elements and (1/10 scaled) NFET programming device 226. The voltage $V_{fuse}$ at the drain terminal of PFET PX is sampled by the non inverting terminal (+) of OPAMP 222 and is compared with the reference voltage $V_1$ from the first current path. Though negative feedback, the output of OPAMP 222 (and thus the PFET PX gate voltage level) is adjusted so as to essentially force $V_{fuse}$ to be essentially equal to $V_1$. With the two voltages equal, a current level is thereby established in the second leg ($I_2$), which corresponds to the current in the first leg ($I_1$). The resulting PFET PX gate voltage level defines the analog voltage level output ICNTL, which can then be applied to the PFET programming devices within each column of the eFUSE array and establish a programming current corresponding to the reference current $I_1$ applied to external pin I_REF.

Accordingly, a very high accuracy can be achieved in replicating the source, drain and gate terminal voltages of PFET PX to the PFET programming devices P0-Pn, since the drain-to-source voltage ($V_{DS}$) of PFET PX is identical to the drain-to-source voltages of the PFET programming devices P0-Pn. Moreover, since the OPAMP 222 effectively causes PX to produce a scaled version of a precise desired fuse programming current, the replication of the PX transistor $V_{DS}$ to the PFET programming devices will produce the desired programming current in the selected bitcells. Again, by using a plurality of series connected reference eFUSEs and reducing the scaling of the reference NFET devices by the same ratio as the reduced reference current, a constant $V_{DS}$ can be maintained across the mimic (PX) and programming PFET devices.

It should be pointed out that the precise steering of programming PFET conditions is more accurate than using a simple current mirror, for example, to produce the desired fuse programming current in the bitcells. In contrast to the active circuit approached disclosed herein, with a conventional current mirror drain modulation of the PFET devices will adversely affect the mirrored current levels, thus adversely affecting the accuracy of the programming current. In the current controlled programming apparatus described, the Po-Pn devices operate in the linear region with high overdrive and therefore conduct more current than a device of comparable size biased in the saturated, current mirror mode. Density is improved by the use of controlled-current programming devices biased in the linear region. Accuracy of the programming current is improved over what could be designed with a current mirror because the drain voltage of the current reference device (Px) and the current supply devices (P0-Pn) are equal and fixed.

Furthermore, with respect to the eFUSE array 202 of FIG. 2, a practical implementation of the programming circuitry is configured such that a single column select signal (CSEL_0, . . . , CSEL_n) and a single row select signal (RSEL_0, . . . , RSEL_n) is asserted at a given time. However, it is also contemplated that multiple columns and/or rows can be concurrently selected.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for regulating electrical fuse (eFUSE) programming current in semiconductor devices, comprising:
a current control generator configured to receive an input reference current through a first current path that includes a first group of reference fuses, the input reference current proportional to a desired eFUSE programming current;
a second current path associated with the current control generator, the second current path including a reference programming FET and a second group of reference fuses; and
a voltage comparator associated with the current control generator, with an output of the voltage comparator coupled to a gate terminal of the reference programming FET so as to adjust the gate voltage of the reference programming FET to equalize a first voltage across the first current path with a second voltage across the second current path;
wherein the gate voltage of the reference programming FET is an output of the current control generator, coupled to corresponding gates of one or more selected programming devices of an eFUSE array such that each of the one or more selected programming devices sources the desired eFUSE programming current to a selected eFUSE to be programmed.

2. The apparatus of claim 1, wherein the magnitude of the reference current is a scaled down factor with respect to the desired programming current so as to prevent programming of the first group of reference fuses.

3. The apparatus of claim 2, wherein the first and second current paths each include an NFET having a conductive strength that is scaled with respect to corresponding NFETS included in programming paths of each of the eFUSEs.

4. The apparatus of claim 1, wherein the reference programming FET and each of the programming devices of the eFUSE array comprise PFET devices having source terminals thereof are coupled to a programming voltage that is higher than a nominal $V_{DD}$ logic high supply rail voltage.

5. The apparatus of claim 4, further comprising a current control block associated with each column of the eFUSE array, the current control block configured to selectively pass the gate voltage of the reference programming PFET to the gate of the corresponding programming PFET device of the eFUSE array.

6. The apparatus of claim 5, wherein the current control block further comprises:
an NFET/PFET pass gate pair having an input node coupled to the gate of the reference programming PFET and an output node coupled to the gate of the corresponding programming PFET device of the eFUSE array;
a gate terminal of the NFET of the NFET/PFET pass gate pair coupled to a column select signal, and a gate terminal of the PFET of the NFET/PFET pass gate pair coupled to an inverted value of the column select signal;
a pull up PFET device having a gate terminal coupled to the column select signal, a source terminal coupled to the programming voltage, and a drain terminal coupled to the gate of the programming PFET device of the eFUSE array;
wherein the NFET/PFET pass gate pair is deactivated whenever the column select signal is not asserted so as to prevent coupling of the gate voltage of the reference programming PFET to the gate of the programming PFET device of the eFUSE array, and wherein the pull up PFET device is activated whenever the column select signal is not asserted so as to maintain the programming PFET device of the eFUSE array in a nonconductive state; and
wherein the NFET/PFET pass gate pair is activated whenever the column select signal is asserted so as to pass the gate voltage of the reference programming PFET to the gate of the programming PFET device of the eFUSE array.

7. The apparatus of claim 6, wherein the voltage of the column select signal in the asserted state is substantially equal to the programming voltage.

8. An electrical fuse (eFUSE) array with programming current control, comprising:
a plurality of bitlines arranged in columns;
a plurality of bitcells associated with each bitline, each bitcell comprising an eFUSE device coupled to the associated bitline and a programming NFET in series with the eFUSE device, with each programming NFET controlled by one of a plurality of row select control signals;
a current control generator configured to receive an input reference current through a first current path that includes a first group of reference fuses, the input reference current proportional to a desired eFUSE programming current;
a second current path associated with the current control generator, the second current path including a reference programming PFET and a second group of reference fuses; and
a voltage comparator associated with the current control generator, with an output of the voltage comparator coupled to a gate terminal of the reference programming PFET so as to adjust the gate voltage of the reference programming PFET to equalize a first voltage across the first current path with a second voltage across the second current path;
wherein the gate voltage of the reference programming PFET is an output of the current control generator, coupled to corresponding gates of programming PFET devices associated with each bitline such that each of the one or more selected programming devices sources the desired eFUSE programming current to a selected eFUSE to be programmed.

9. The eFUSE array of claim 8, wherein the magnitude of the reference current is a scaled down factor with respect to the desired programming current so as to prevent programming of the first group of reference fuses.

10. The eFUSE array of claim 9, wherein the first and second current paths each include an NFET having a conductive strength that is scaled with respect to corresponding NFETs included in each bitcell.

11. The eFUSE array of claim 8, wherein the source terminals of the reference programming PFET and the programming PFET devices associated with each bitline are coupled to a programming voltage that is higher than a nominal $V_{DD}$ logic high supply rail voltage.

12. The eFUSE array of claim 11, further comprising a current control block associated with each bitline, the current control block configured to selectively pass the gate voltage of the reference programming PFET to the gate of the corresponding programming PFET device of a selected bitcell coupled to the bitline.

13. The eFUSE array of claim 12, wherein the current control block further comprises:
an NFET/PFET pass gate pair having an input node coupled to the gate of the reference programming PFET and an output node coupled to the gate of the corresponding programming PFET device of the eFUSE array;

a gate terminal of the NFET of the NFET/PFET pass gate pair coupled to a column select signal, and a gate terminal of the PFET of the NFET/PFET pass gate pair coupled to an inverted value of the column select signal;

a pull up PFET device having a gate terminal coupled to the column select signal, a source terminal coupled to the programming voltage, and a drain terminal coupled to the gate of the programming PFET device of the eFUSE array;

wherein the NFET/PFET pass gate pair is deactivated whenever the column select signal is not asserted so as to prevent coupling of the gate voltage of the reference programming PFET to the gate of the programming PFET device of the eFUSE array, and wherein the pull up PFET device is activated whenever the column select signal is not asserted so as to maintain the programming PFET device of the eFUSE array in a nonconductive state; and wherein the NFET/PFET pass gate pair is activated whenever the column select signal is asserted so as to pass the gate voltage of the reference programming PFET to the gate of the programming PFET device of the associated bitline.

14. The eFUSE array of claim 13, wherein the voltage of the column select signal in the asserted state is substantially equal to the programming voltage.

15. A method for regulating electrical fuse (eFUSE) programming current in semiconductor devices, the method comprising:

configuring a current control generator to receive an input reference current through a first current path that includes a first group of reference fuses, the input reference current proportional to a desired eFUSE programming current;

configuring a second current path associated with the current control generator, the second current path including a reference programming FET and a second group of reference fuses; and configuring a voltage comparator associated with the current control generator, with an output of the voltage comparator coupled to a gate terminal of the reference programming FET so as to adjust the gate voltage of the reference programming FET to equalize a first voltage across the first current path with a second voltage across the second current path;

wherein the gate voltage of the reference programming FET is an output of the current control generator, coupled to corresponding gates of one or more selected programming devices of an eFUSE array such that each of the one or more selected programming devices sources the desired eFUSE programming current to a selected eFUSE to be programmed.

16. The method of claim 15, wherein the magnitude of the reference current is a scaled down factor with respect to the desired programming current so as to prevent programming of the first group of reference fuses.

17. The apparatus of claim 16, wherein the first and second current paths each include an NFET having a conductive strength that is scaled with respect to corresponding NFETS included in programming paths of each of the eFUSEs.

18. The method of claim 15, wherein the reference programming FET and each of the programming devices of the eFUSE array comprise PFET devices having source terminals thereof are coupled to a programming voltage that is higher than a nominal $V_{DD}$ logic high supply rail voltage.

19. The apparatus of claim 18, further comprising configuring a current control block associated with each column of the eFUSE array, the current control block configured to selectively pass the gate voltage of the reference programming PFET to the gate of the corresponding programming PFET device of the eFUSE array, wherein configuring the current control block further comprises:

coupling an NFET/PFET pass gate pair having an input node to the gate of the reference programming PFET and coupling an output node to the gate of the corresponding programming PFET device of the eFUSE array;

coupling a gate terminal of the NFET of the NFET/PFET pass gate pair to a column select signal, and coupling a gate terminal of the PFET of the NFET/PFET pass gate pair to an inverted value of the column select signal;

coupling a pull up PFET device having a gate terminal to the column select signal, coupling a source terminal coupled to the programming voltage, and coupling a drain terminal to the gate of the programming PFET device of the eFUSE array;

wherein the NFET/PFET pass gate pair is deactivated whenever the column select signal is not asserted so as to prevent coupling of the gate voltage of the reference programming PFET to the gate of the programming PFET device of the eFUSE array, and wherein the pull up PFET device is activated whenever the column select signal is not asserted so as to maintain the programming PFET device of the eFUSE array in a nonconductive state; and wherein the NFET/PFET pass gate pair is activated whenever the column select signal is asserted so as to pass the gate voltage of the reference programming PFET to the gate of the programming PFET device of the eFUSE array.

20. The method of claim 19, wherein the voltage of the column select signal in the asserted state is substantially equal to the programming voltage.

* * * * *